United States Patent [19]

Sumi

[11] Patent Number: 4,625,298
[45] Date of Patent: Nov. 25, 1986

[54] SEMICONDUCTOR MEMORY DEVICE

[75] Inventor: Tadashi Sumi, Itami, Japan

[73] Assignee: Mitsubishi Denki Kabushiki Kaisha, Tokyo, Japan

[21] Appl. No.: 641,551

[22] Filed: Aug. 16, 1984

[30] Foreign Application Priority Data

Sep. 14, 1983 [JP] Japan ................................. 58-170679

[51] Int. Cl.⁴ .............................................. G11C 7/00
[52] U.S. Cl. ..................................... 365/190; 365/203
[58] Field of Search ............... 365/189, 190, 203, 205, 365/201, 207, 208

[56] References Cited

U.S. PATENT DOCUMENTS 4,103,345  7/1978  Suzuki et al. ........................ 365/190
4,409,674 10/1983  Takahashi ........................... 365/190

OTHER PUBLICATIONS

Yasuda et al, "1982 Symposium on VLSI Technology, Digest of Technical Papers", pp. 14–15, (1982).

Primary Examiner—Joseph A. Popek
Attorney, Agent, or Firm—Birch, Stewart, Kolasch and Birch

[57] ABSTRACT

A semiconductor memory device with a static Random Access Memory having an internally generated timing system, which includes a detecting circuit intended to detect the completion of operation of a sense amplifier; and a control circuit intended to place the word lines of the memory in an unselected state upon reception of the output signal from the detecting circuit.

6 Claims, 12 Drawing Figures

F I G 4.
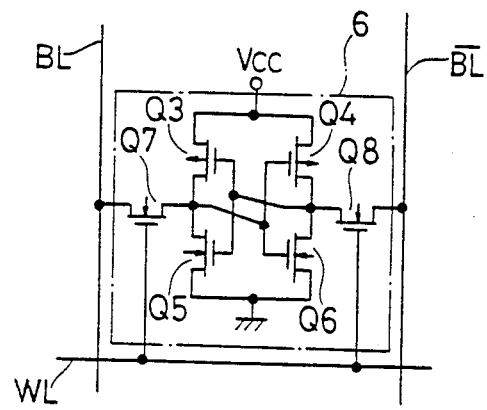
F I G 5.
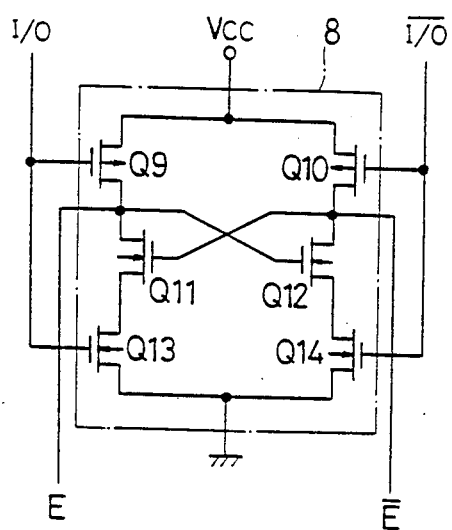

SEMICONDUCTOR MEMORY DEVICE

FIELD OF THE INVENTION

The present invention relates to a semiconductor memory device constituting a complementary Metal-Oxide-Semiconductor Random Access Memory (hereinafter referred to as a "CMOS RAM"), and more particularly to that wherein the voltage amplitudes of the internal signals are reduced, resulting in reduced charging currents.

BACKGROUND OF THE INVENTION

In conventional CMOS RAMs, dc currents flow constantly through the devices, and the dc currents increase with the increase of memory capacity for one chip caused by the increase of integration density.

One method proposed to solve this problem is a so-called edge sense circuit system wherein clocks are not supplied from the outside but are generated internally to be used for its dynamic operation by detecting changes of address signals. Under this system which is also called as an internally synchronized circuit system, dc currents do not flow, and only the charging current flows in the dynamic operation, thereby reducing currents to a great extent.

To exemplify a conventional edge sense type CMOS RAM, reference will be particularly made to FIG. 1.

The reference numeral 1 designates terminals for an address input, and the reference numeral 2 designates an edge detector which detects the change of the input address signal. The reference numeral 3 designates a NOR gate to which the outputs of the edge detectors 2 are input. The reference numeral 4 designates a pre-charge signal generator which generates a pre-charge signal $\phi p$. The reference numeral 5 designates a word line control circuit which controls the word line B so as to select a desired memory cell. The reference numeral 6 designates a memory cell, the reference numeral 7 designates a Y-address decoder, and the reference numeral 8 designates a sense amplifier for amplifying the output signal from the memory cell 6. The reference numeral 9 designates an output buffer for taking the output signal to the outside. The reference symbols A, B, C, and D designate a pre-charge signal ($\phi p$) line, a word line (WL), a pair of bit lines (BL), and input/output (I/O) lines, respectively. The reference symbol E designates two output lines of the sense amplifier 8. The reference symbol $Q_1$ designates a transistor for charging the bit lines C, and the reference symbol $Q_2$ designates a switching transistor for connecting or disconnecting the bit lines C and the I/O lines D.

The device will be operated as follows:

When the input address signal 1 changes, the edge detector 2 detects the change, and outputs a one-shot pulse. The NOR gate 3 operates to transmit any pulse to the next stage which is generated by any one of the edge detectors 2. The pre-charge signal generator 4 generates a negative one-shot pulse when it receives the pulse from the NOR circuit 3.

When the pre-charge signal $\phi p$ on the line A becomes "L" level at time $t_1$ in FIG. 2, the P-channel transistor $Q_1$ turns on, and charges the bit lines C and the I/O lines D up to the "H" level. Then, the output lines E of the sense amplifier 8 are reset to "L" level. The pre-charge signal $\phi p$ recovers to "H" level at time $t_2$ after the charging is completed.

Next, the word line control circuit 5 operates to make the word line B rise to the "H" level after the pre-charge signal $\phi p$ becomes "H" level. The memory cell 6 is driven by this rising of the word line B, and either one of a pair of bit lines C associated with a memory cell, 6 is discharged to become "L" level in accordance with the content of that memory cell 6. Then, the I/O lines D change in the same way as either one of the pair of the bit lines C to which the I/O lines D are connected through corresponding pair of transistors $Q_2$ which are turned on by the output of the corresponding Y-address decoder 7.

At time $t_3$ when the voltage of one of the I/O lines D decreases to some extent and a voltage difference arises between the pair of I/O lines D, one of the lines E rises up to the "H" level. Thereafter, data is output at the output terminal 10 through the output buffer 9. After time $t_3$, the bit lines C and the I/O lines D continue to discharge being driven by the memory cell 6, and finally fall to ground level.

The flowing current Icc through the device throughout this operation is a charging current from only in the time $t_1$ to $t_3$, and no current flows after time $t_3$ when the operation is completed. Accordingly, the average current in one cycle becomes very small. However, in this system, all the bit lines are charged at the same time, resulting in a sharp rising and falling in the current (Icc) waveform.

Under the conventional system described above, it is necessary to charge the bit lines up to the power supply voltage from the ground level, and this causes an increase of charging currents with the increased number of bit lines caused by increasing the memory capacity for one chip. This results in not only an increased power consumption but also a sharp rising and falling in the current waveform, which gives rise to noise inside and outside of the chip, possibly leading to a malfunction of the device.

OBJECTS AND SUMMARY OF THE INVENTION

The present invention is directed to solve the problems pointed out above, and has for its object to provide an improved semiconductor memory device wherein the voltage amplitude of the bit lines is reduced, resulting in reduced charging currents.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a semiconductor memory device constituting a static Random Access Memory of with an internally synchronized circuitry system, which comprises: a detecting circuit intended to detect the completion of operation of a sense amplifier; and a control circuit intended to make the word line in an unselected state upon reception of the output signal from the detecting circuit.

BRIEF DESCRIPTION OF THE DRAWINGS

FIG. 4 is a detail of a memory cell included in the circuit of FIG. 3;

FIG. 5 is a detail of the sense amplifier included in the circuit of FIG. 3;

DETAILED DESCRIPTION OF THE PREFERRED EMBODIMENTS

Figure 1:
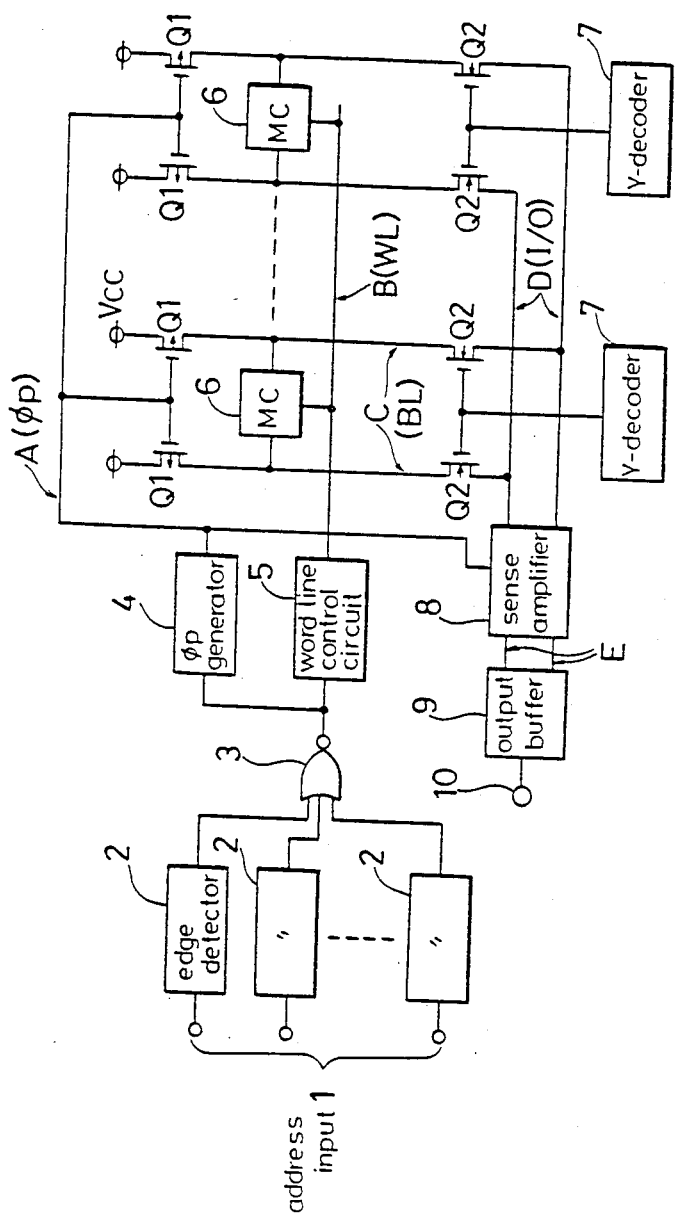
FIG. 1 shows a circuit diagram of a conventional CMOS RAM.
Figure 2:
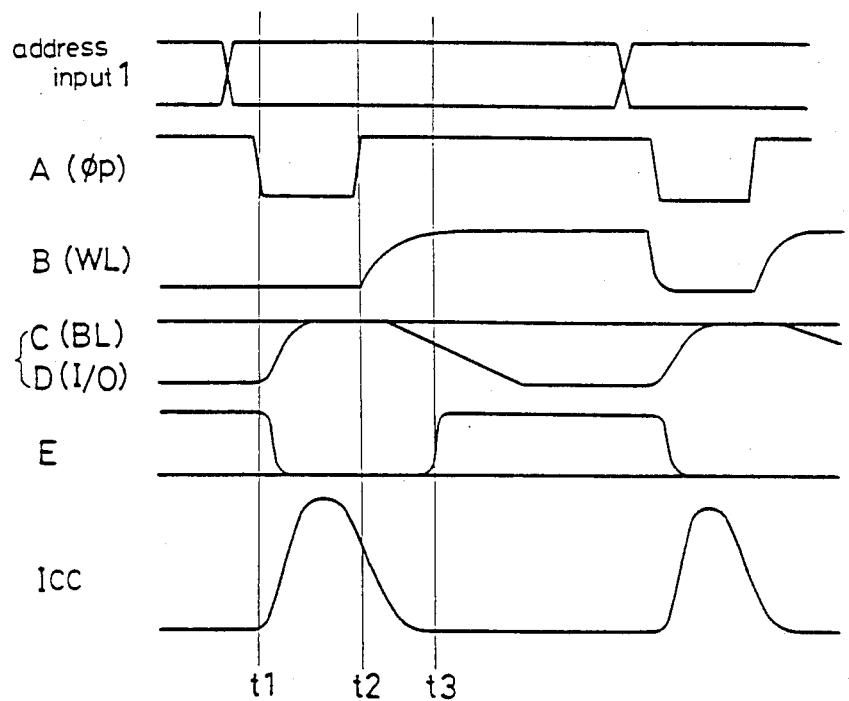
FIG. 2 shows a timing diagram exemplifying the operation of the device of FIG. 1.
Figure 3:
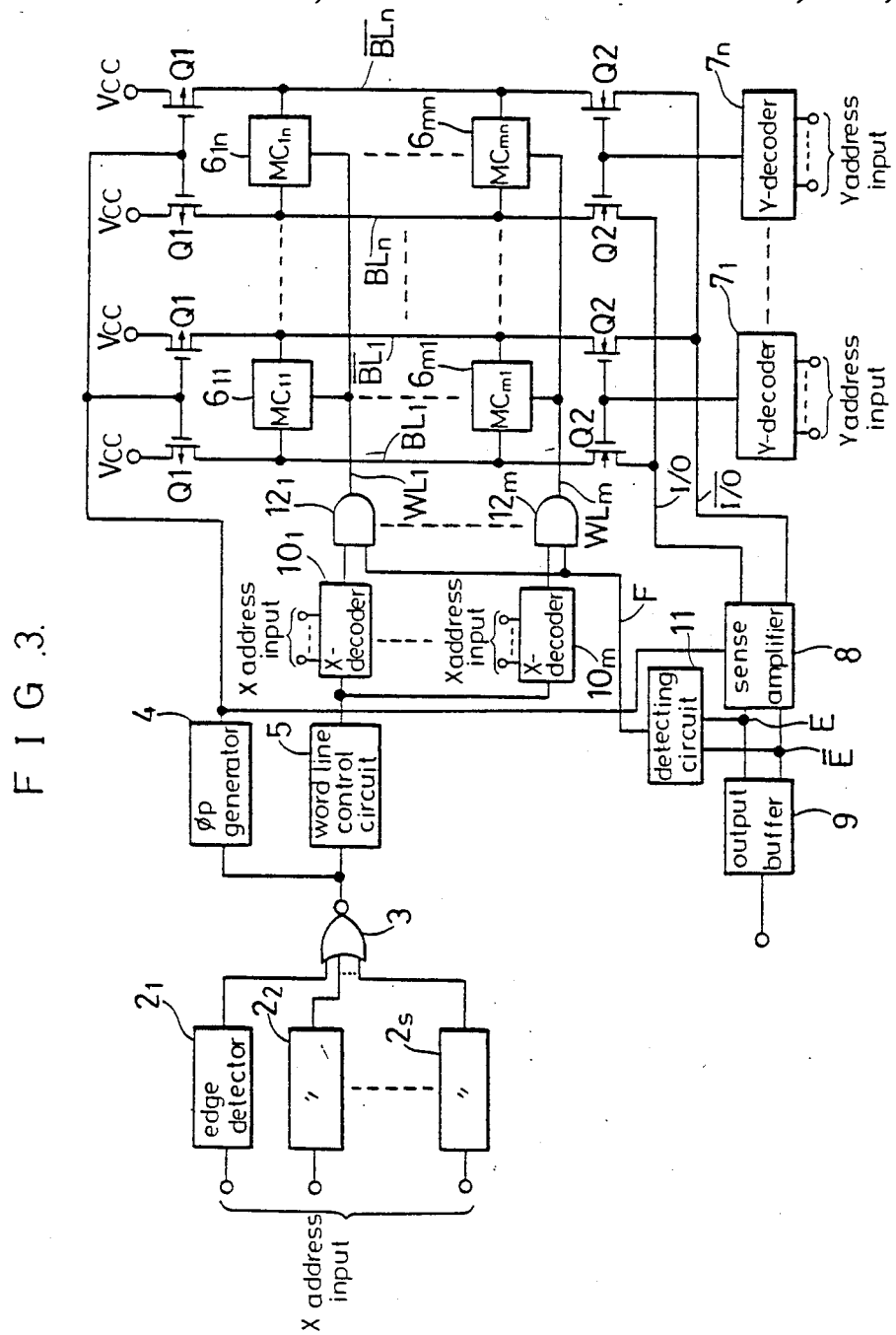
FIG. 3 shows a circuit diagram of one embodiment of the present invention.

Reference will now be particularly made to FIG. 3 wherein like reference numerals are used to designate like or corresponding parts or elements as those in FIG. 1. The reference numerals $2_1$ to $2_s$ designate edge detectors each of which detects the change of each bit of the X-address input which is input thereto. Each edge detector outputs a one-shot pulse when each bit of the X-address input changes from "H" to "L" or from "L" to "H". The reference numeral 3 designates a NOR gate to which all of the outputs of the edge detectors $2_1$ to $2_s$ are input. The NOR gate 3 outputs a pulse signal when any one of the edge detectors $2_1$ to $2_s$ outputs a one-shot pulse. The reference numeral 4 designates a pre-charge signal generator which outputs a negative one-shot pulse of a predetermined period when it receives the pulse signal from the NOR gate 3. The output of the pre-charge signal generator 4 is connected to the control electrodes of a pair of charging transistors Q1, Q1 so as to turn ON the charging transistors while the negative one-shot pulse is generated. The reference numeral 5 designates a word line control circuit which outputs a signal of "H" of a predetermined period after the falling of the negative one-shot pulse from the pre-charge signal generator 4 upon reception of the pulse signal from the NOR gate 3. The edge detectors $2_1$ to $2_s$, the NOR gate 3, the pre-charge signal generator 4 and the word line control circuit 5 are constituted under the construction shown in FIG. 3 in Page 15 of DIGEST OF TECHNICAL PAPERS OF 1982 SYMPOSIUM ON VLSI TECHNOLOGY promoted by The Japan Society of Applied Physics and the IEEE Electron Devices Society.

The reference numerals $6_{11}$ to $6_{mn}$ designate m×n static memory cells arrayed in a matrix of m rows and n columns. Each memory cell is represented by a well-known CMOS static memory cell constituted by two P-channel MOS transistors Q3, Q4 and four N-channel MOS transistors Q5 to Q8 as shown in FIG. 4. Each memory cell outputs complementary signals from corresponding pair of bit lines BL, $\overline{BL}$. In the Figure, only four memory cells are illustrated.

The reference numerals $7_1$ to $7_n$ designate Y-decoders to which the Y-address inputs are input, and control electrodes of a pair of switching transistors Q2, Q2 are connected to the output of the decoders. The Y-address decoders are intended to turn ON the pair of switching transistors Q2, Q2 which are connected to the memory cells to be selected and to turn OFF the pair of switching transistors Q2, Q2 which are connected to the memory cells not to be selected.

The numeral 8 designates a sense amplifier which is connected to the I/O and $\overline{I/O}$ lines, amplifies the signals of the I/O and $\overline{I/O}$ lines and outputs the amplified signal. The sense amplifier 8 is represented by the circuit shown in FIG. 5, constituted by four P-channel MOS transistors Q9 to Q12 and two N-channel MOS transistors Q13, Q14. The numerals $10_1$ to $10_m$ designate X-decoders to which the X-address input is input and to the output whereof the word lines $WL_1$ to $WL_m$ are connected. The X-decoders are activated upon reception of the output signal of "H" level from the word line control circuit 5, and make the word lines connected to the memory cells that are selected by the X-address input the "H" level, holding the word lines connected to the memory cells not to be selected at the "L" level. The reference numeral 11 designates a detecting circuit intended to detect the completion of operation of a sense amplifier 8 and output an output signal to the line F. For example, the detecting circuit 11 is constituted by a NOR gate to which the output signals E, $\overline{E}$ of the sense amplifier 8 are input. The numerals $12_1$ to $12_m$ designate AND gates with one input connected to the output of the X-decoders $10_1$ to $10_m$ and the other input is connected to the output of the detecting circuit 11. The output of the AND gates are connected to the word lines $WL_1$ to $WL_m$ are connected.

The static RAM with such a construction will be operated as described below.

Figure 6:
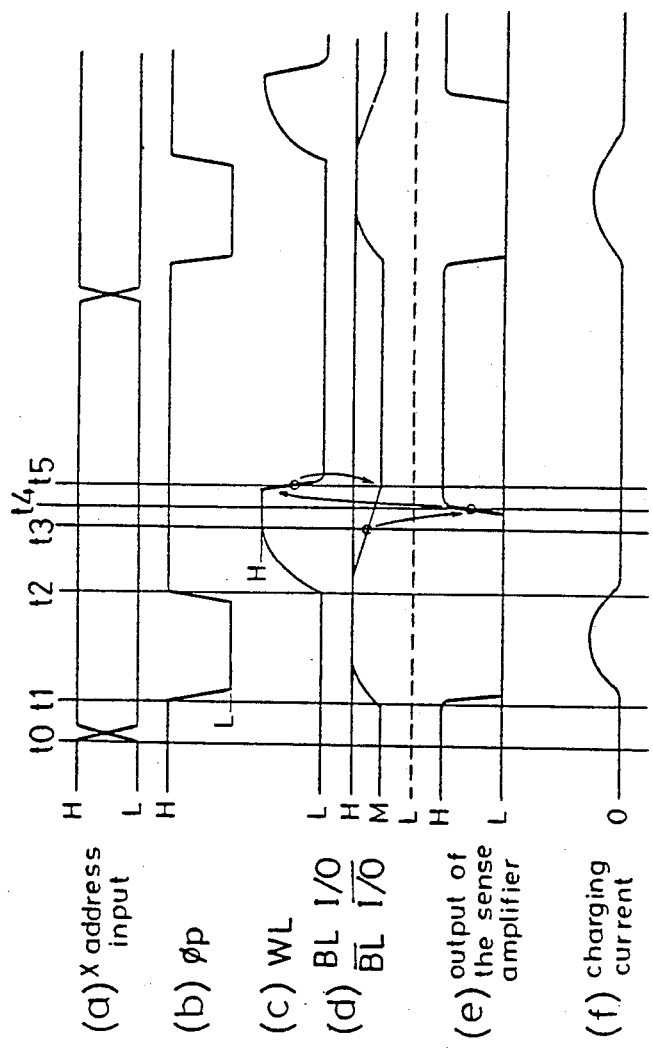
FIGS. 6(a) to 6(f) show a timing diagram exemplifying the operation of the device of FIG. 3.

When the X-address input changes so as to select a desired memory cell, for example, the memory cell $6_{11}$, at time $t_0$, in other words, when at least one bit of the X-address input changes from "H" to "L" or from "L" to "H" as shown in FIG. 6(a) at time $t_0$, a one-shot pulse is generated from at least one of the edge detectors $2_1$ to $2_s$, and this one-shot pulse is output through the NOR gate 3. When the pre-charge signal generator 4 receives the pulse signal from the NOR gate 3, the pre-charge signal generator 4 generates a negative one-shot pulse $\phi p$ having a time period from $t_1$ to $t_2$ as shown in FIG. 6(b). Then, all pairs of charging transistors Q1, Q1 are turned ON by the negative one-shot pulse, and the bit lines $BL_1$, $\overline{BL_1}$ to $BL_n$, $\overline{BL_n}$ are pre-charged by the power supply voltage Vcc to become "H" as shown in FIG. 6(d). Then, one of the Y-decoders $7_1$ to $7_n$, for example, the Y-decoder $7_1$ in a case of selecting the memory cell $6_{11}$, outputs an output signal of "H", thereby turning ON the switching transistors Q2, Q2 corresponding to the Y-decoder $7_1$, whereby the I/O and $\overline{I/O}$ lines are made "H" as shown in FIG. 6(d). On the other hand, the sense amplifier 8 is reset by the one-shot pulse from the pre-charge signal generator 4, and both of its outputs E, $\overline{E}$ become "L" at time $t_1$ as shown in FIG. 6(e). The output of the word line control circuit 5 which receives the pulse signal from the NOR gate 3 changes to "H" at time $t_2$, that is, at the completion of the one-shot pulse from the pre-charge signal generator 4, and it continues to output a signal of "H" until it receives the next pulse signal from the NOR gate 3. Hereupon, the output from the pre-charge signal generator 4 is "H" at time $t_2$, whereby all pairs of charging transistors Q1, Q1 are turned OFF. Then, the X-decoders $10_1$ to $10_m$ receive the "H" signal from the word line control circuit 5 to be energized, and one of the X-decoders $10_1$ to $10_m$, for example, the X-decoder $10_1$ in a case of selecting the memory cell $6_{11}$ outputs a signal of "H", and the word line $WL_1$ is charged up to "H" from the timing $t_2$ as shown in FIG. 6(c). As a result, the transistors Q7 and Q8 of the memory cell shown in FIG. 4 are turned ON, whereby the content of the memory cell is read out to the pair of bit lines BL, $\overline{BL}$. That is, in the memory cell one of the transistors Q5 and Q6 of the memory cell is ON, and the other is OFF in accordance with the content of the memory cell, whereby the bit line connected to the ON state transistor is discharged to become "L" through this transistor, and the bit line connected to the OFF state transistor is held at its "H" level. At the same time, the I/O and $\overline{I/O}$ lines are connected to the bit lines BL and $\overline{BL}$ through the switching transistors Q2 and Q2 corresponding to the selected memory cell, for example, the memory cell $6_{11}$, and accordingly they change in the same manner as the bit lines BL, $\overline{BL}$. Hereupon, switching transistors except for those selected by the Y-decoder are turned off. Thereafter, at time $t_3$ when a predetermined voltage difference arises between the pair of bit lines BL, $\overline{BL}$ connected to the selected memory cell $6_{11}$, the sense amplifier 8 is driven to make one of its outputs rise up to "H" from "L" in accordance with the voltages of the I/O and $\overline{I/O}$ lines. The detecting circuit 10 starts to operate in accordance with the outputs E, $\overline{E}$ of the sense amplifier 8 at time $t_4$ to output "L" to its output F. Then, the outputs of the AND gates $12_1$ to $12_m$ become "L" at the timing $t_5$, thereby making the word line $WL_1$ "L". The memory cell $6_{11}$ which is connected to the bit line $BL_1$, $\overline{BL_1}$ is disconnected therefrom is this way, and the bit line $BL_1$, $\overline{BL_1}$ maintains its intermediate level without falling down after time $t_5$. On the other hand, the output buffer 9 outputs an output signal in accordance with the content of the selected memory cell $6_{11}$ upon reception of the outputs E, $\overline{E}$ of the sense amplifier 8. Thereafter, the content of the selected memory cell $6_{11}$ is read out, and the bit lines $BL_1$, $\overline{BL_1}$ to $BL_n$, $\overline{BL_n}$ are all pre-charged to "H" by a negative one-shot pulse from the pre-charge signal generator 4 based upon the next X-address input. Thereafter, the content of the memory cell selected by the X- and Y- address inputs are read out to the output terminal in the same manner as described above.

In the static RAM of such a construction, the current flowing through a reading operation from one selected memory cell only includes a charging current which flows from time $t_1$ to $t_3$, and no current flows after time $t_3$ to the pre-charging timing (corresponding to the $t_1$) in the next reading operation from the next selected memory cell. Furthermore, unnecessary discharges in the bit lines are prevented by separating the memory cell from the bit lines after reading data from the memory cell, that is, after time $t_5$.

Accordingly, the voltage amplitude of the bit lines becomes small which bit lines should be charged up at the next cycle, thereby reducing charging currents to a great extent. It is possible to attain a greatly reduced power consumption, and to smooth the rising and falling of the current waveform as well as to obtain a static operation with reduced noises.

When the writing should be done successively to the reading in a same cell, it is necessary to connect the cell to the word line again by making the word line "H" level. To accomplish this operation, it is necessary to provide a logical circuit which makes the word line "H" level again when the writing instruction is applied thereto. This logical circuit is not shown because it is not pertinent to the gist of the present invention. This can be easily realized by giving some alterations to the AND gates $12_1$ to $12_m$ and applying a signal from the writing circuit thereto.

Figure 7:
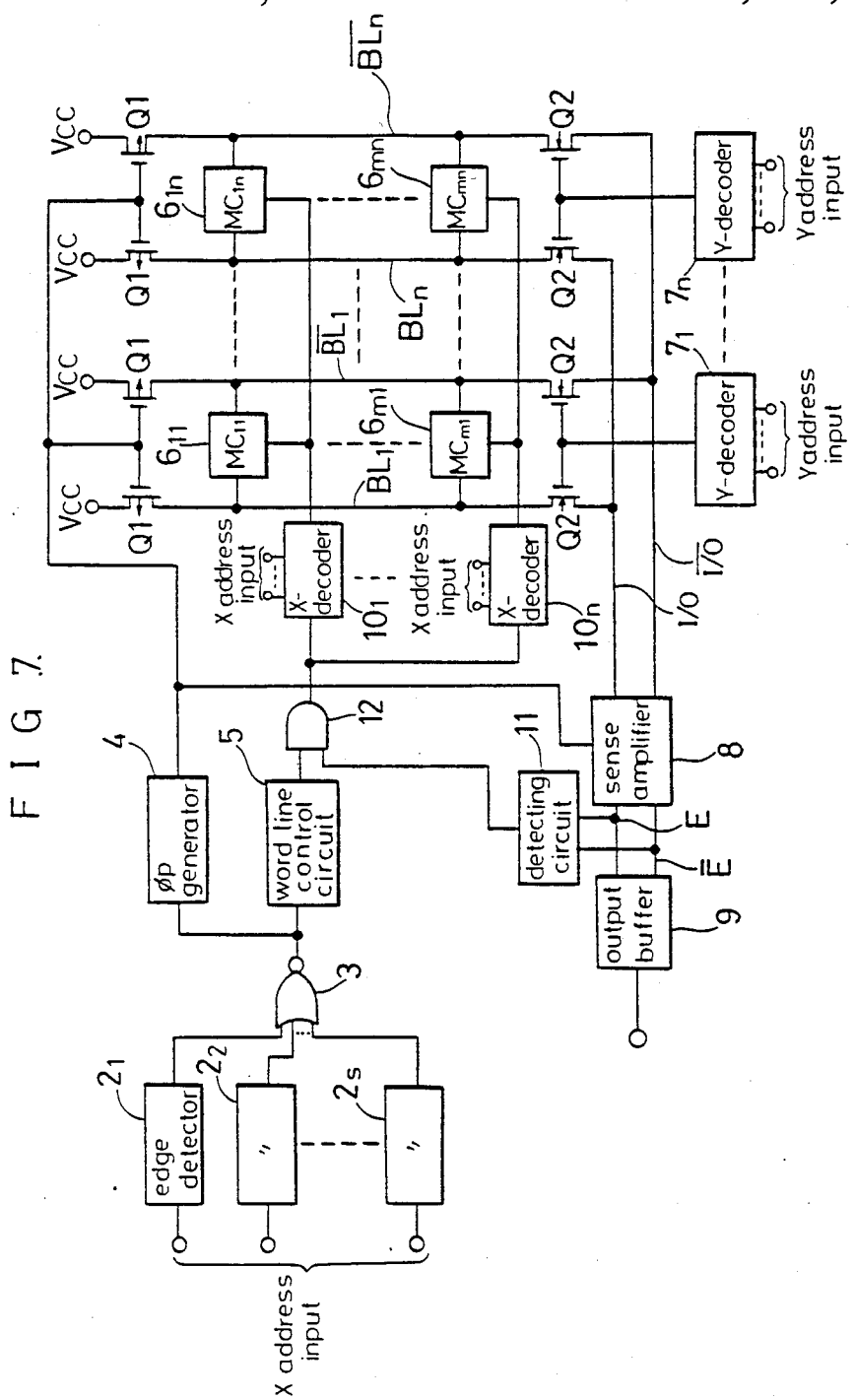
FIG. 7 is a circuit diagram of a second embodiment of the present invention.

Another embodiment of the present invention is illustrated in FIG. 7. Different from the embodiment in FIG. 3, there is provided an AND gate 12 between the word line control circuit 5 and the X-decoders $10_1$ to $10_m$, and each X-decoder $10_1$ to $10_m$ is connected to each word line $WL_1$ to $WL_m$.

This embodiment has an advantage of reducing the number of AND gates as well as the same advantages as those of the embodiment in FIG. 3.

As is evident from the foregoing description, according to a present invention, the memory cell is disconnected from the sense amplifier after the data are read out therefrom based upon the detection of the change of the output from the sense amplifier. This produces an effect of reducing the voltage amplitude of the bit lines, resulting in reduced charging currents.

What is claimed is:

1. A semiconductor memory device with a static Random Access Memory having an internally generated timing system, comprising:
   a plurality of memory cells;
   a plurality of word lines connected to said memory cells for selecting one of said plurality of memory cells for a read/write operation;
   sensing means for sensing a data reading output of said one of said plurality of memory cells;
   detecting means responsive to said sensing signal for producing a control signal when a sensing operation is completed; and
   control means responsive to said control signal for placing said word lines in an unselected state.

2. A semiconductor memory device, comprising:
   a memory cell array including m×n static memory cells arranged in a matrix of m rows and n columns;
   n pairs of bit lines, a pair of said n pairs of bit lines corresponding to each of said n columns, with the memory cells arranged in the corresponding column connected to said pair of bit lines;
   m pairs of word lines, a pair of said m pairs of word lines corresponding to each of said m rows, with the memory cells arranged in the corresponding row connected to said pair of word lines;
   precharging means for pre-charging the n pairs of bit lines up to a predetermined voltage;
   n pairs of MOS transistors, one of said n pairs of bit lines corresponding to a respective pair of said n pairs of MOS transistors;
   a pair of I/O lines connected to all the n pairs of bit lines through said respective pairs of MOS transistors connected to said corresponding pairs of bit lines and each of said I/O lines carrying an output signal from a selected one of said m×n static memory cells;
   a sense amplifier for amplifying said output signal of each of said I/O lines and outputting a pair of amplified signals;
   a detecting circuit for detecting a voltage difference between said pair of amplified signals and outputting a control signal when said voltage difference exceeds a predetermined value; and
   a control circuit responsive to said control signal for placing said word lines into an unselected state.

3. The semiconductor memory device of claim 2 further comprising selection means for selecting said selected one of said m×n static memory cells using row address signals and column address signals.

4. The semiconductor memory device claim 3 wherein said selection means comprises:
   m row address decoders for selecting one of said word lines in accordance with one of said row address signals;

word line control means for activating one of said row address decoders after said precharging means precharges said n pairs of bit lines; and n column address decoders for selecting one of said n pairs of bit lines in accordance with one of said column address signals.

5. The semiconductor memory device of claim 4 further comprising timing means responsive to changes in a row address signal for triggering said precharging means and for triggering said word line control means.

6. The semiconductor memory device of claim 5 wherein said precharging means includes a power supply and n pairs of switching transistors for connecting said power supply to each of said n pairs of bit lines, said timing means switching said switching transistors ON and OFF in accordance with said changes in said row address signal.

* * * * *